United States Patent [19]

Marie

[11] Patent Number: 5,138,276
[45] Date of Patent: Aug. 11, 1992

[54] DISTORTION-COMPENSATED DIFFERENTIAL CIRCUIT

[75] Inventor: Hervé Marie, Louvain-la-Neuve, Belgium

[73] Assignee: U.S. Philips Corporation, New York, N.Y.

[21] Appl. No.: 686,328

[22] Filed: Apr. 16, 1991

[30] Foreign Application Priority Data

Apr. 19, 1990 [FR] France ................................. 90 05009

[51] Int. Cl.$^5$ ............................................... H03F 3/45
[52] U.S. Cl. ..................................... 330/252; 330/149
[58] Field of Search .......................... 330/69, 149, 252

[56] References Cited

U.S. PATENT DOCUMENTS 4,794,348 12/1988 McGinn .............................. 330/252
4,820,997 4/1989 Sano et al. ......................... 330/252

Primary Examiner—James B. Mullins
Attorney, Agent, or Firm—Bernard Franzblau

[57] ABSTRACT

A distortion compensated differential circuit. One embodiment of the circuit includes a differential follower stage comprising first ($T_1$) and second ($T_{\bar{1}}$) transistors having their respective collectors connected to a supply voltage source ($V_{cc}$). The bases of these transistors receive a first ($V_1$) and a second ($V_2$) input signal and their emitters are coupled together by a first impedance (Z) and are further connected to a first ($I_1$) and a second ($I_{\bar{1}}$) current source, respectively. The connections between the emitters of the first and the second transistors and the first and the second current sources, respectively, are made via the base-emitter paths of third ($T_{11}$) and fourth ($T_{12}$) transistors, respectively. The collectors of the third ($T_{11}$) and the fourth ($T_{12}$) transistors are connected to the bases of the fourth ($T_{12}$) and the third ($T_{11}$) transistors, respectively. The emitters of the third ($T_{12}$) and the fourth ($T_{12}$) transistors are coupled to one another by at least a second impedance (Z') of a nominal value which is less than that of the first impedance.

15 Claims, 3 Drawing Sheets

DISTORTION-COMPENSATED DIFFERENTIAL CIRCUIT

BACKGROUND OF THE INVENTION

This invention relates to a distortion-compensated differential circuit which comprises a differential stage comprising a first and a second transistor whose emitters are coupled by a first impedance, and input terminals for an input signal source, and which also comprises a distortion compensation circuit comprising in series between the emitter of the first transistor and a first current source, a first diode as well as the main current path of a third transistor, and also comprising, in series between the emitter of the second transistor and a second current source, a second diode as well as the main current path of a fourth transistor, which third and fourth transistors have their respective bases and collectors interconnected and have their emitters coupled by a second impedance.

Such a differential circuit is known from U.S. Pat. No. 4,682,098 in the form of a voltage-current converter comprising a voltage source V, the first impedance being constituted by a resistor which converts said voltage into a current which is amplified by a translinear circuit comprising four transistors. The first and the second transistor have their collectors as well as their bases interconnected. In order to compensate for conversion non-linearity caused by the non-linearity of the emitter resistance of the first and the second transistor, U.S. Pat. No. 4,682,098 couples a resistor of the same value as the first resistor between the emitters of the third and the fourth transistor.

This compensation provides very remarkable results in the case of small signals.

However, in particular in the case of flash-type fold and interpolation analog-to-digital converters, there is a need to provide compensation over a very wide dynamic range, up to levels of several volts at the output of a differential amplifier.

SUMMARY OF THE INVENTION

It is an object of the invention to provide such a compensation.

To this end the second impedance has a nominal value smaller than that of the first impedance.

As will be demonstrated hereinafter, this very simple modification enables the distortion figures to be improved by providing compensation for the base currents of the third and the fourth transistor, at least to a specific degree.

In a preferred embodiment the circuit is characterized in that the ratio between the second impedance and the first impedance is within the range of values from 0.65 to 0.85.

In a first modification, derived from said U.S. Pat. No. 4,468,098, the differential stage is adapted to form a voltage-current converter, said input terminals being arranged in series with the first impedance.

In a second modification the differential stage is adapted to form a differential follower, the bases of the first and the second transistor forming said input terminals.

The invention also relates to a multiple follower circuit, in particular for use in flash-type folding and interpolation analog-to-digital converters.

Such a multiple follower circuit comprises a plurality of differential follower circuits as defined above, the first, the second, the third and the fourth transistor of the differential follower circuit of the rank i being denominated $T_i^A$, $T_i^A$, $T_i^c$ and $T_i^c$ respectively. This multiple follower circuit, comprises first impedances connected between the emitters of at least some of the transistors of a first group comprising the first and the second transistor, the admittance of said first impedances being designated Y followed by two indexes corresponding to those of the two transistors of said first group between whose emitters said impedance is connected, and second impedances connected between the emitters of at least some of the transistors of a second group comprising the third and the fourth transistor, the admittance of said second impedances being designated Y' followed by two indexes corresponding to those of the two transistors of said second group between whose emitters said impedance is connected, and regardless of i, j, ī and j̄ the following is valid $$Y_{ij}=Y_j-> Y_{ij}=Y_j-$$

$$Y_{\bar{i}j}=Y_j-> Y_{ij}=Y-$$

BRIEF DESCRIPTION OF THE DRAWINGS

The invention will now be described in more detail, by way of non-limitative example, with reference to the accompanying drawings, in which.

DESCRIPTION OF THE PREFERRED EMBODIMENTS

Figure 1:
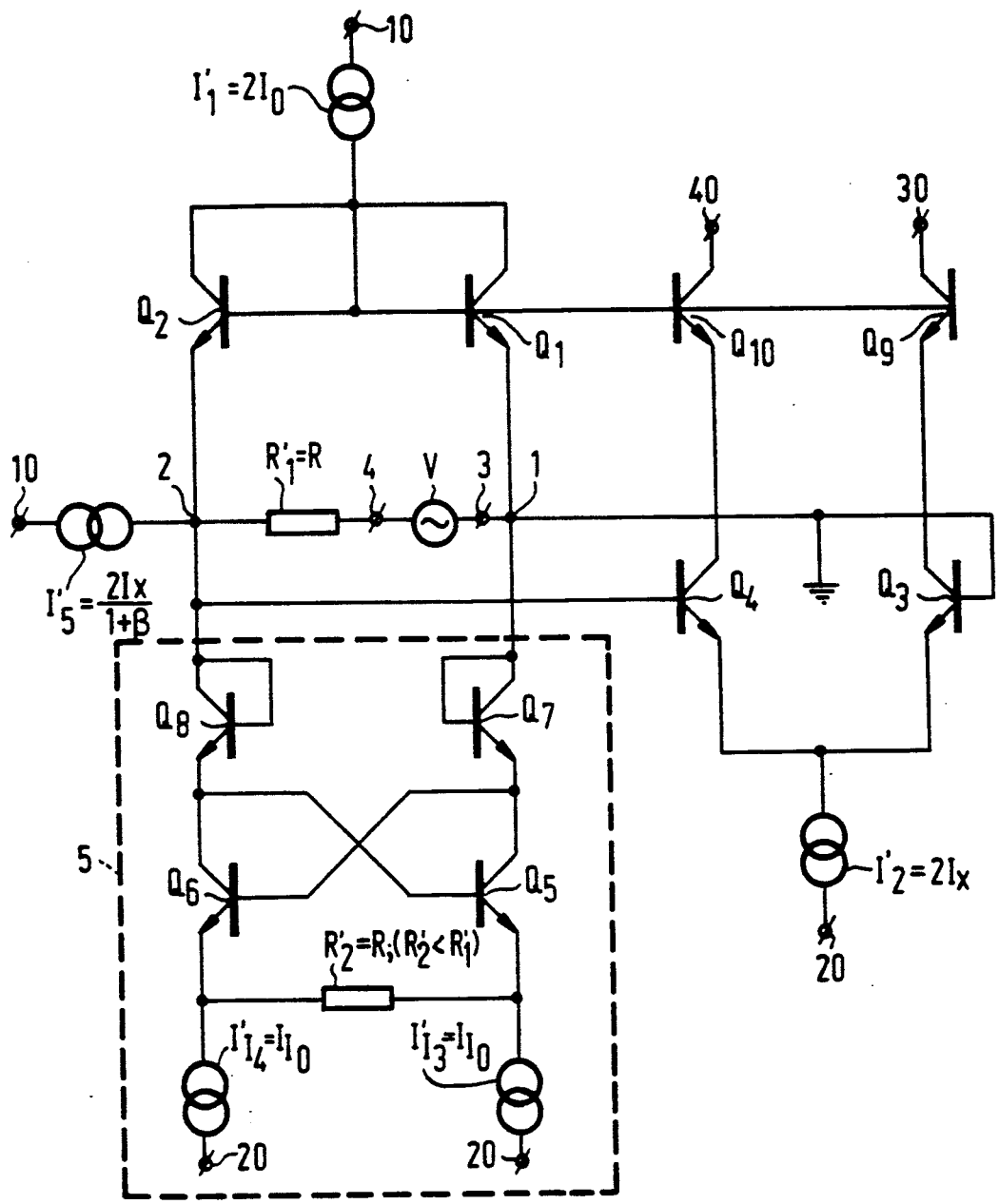
FIG. 1 shows a voltage-current converter in accordance with U.S. Pat. No. 4,682,098.

In FIG. 1 a voltage-current converter comprises a source $I'_1$ of current (value $2 I_o$) coupled to a terminal 1, which is at a reference potential, by means of a diode-connected transistor $Q_1$ and to a terminal 2 by means of a diode-connected transistor $Q_2$. The bases of the transistors $Q_3$ and $Q_4$ are connected to the terminals 1 and 2, respectively. The emitters of the transistors $Q_3$ and $Q_4$ are coupled to a source $I'_2$ of current (value $2I_x$). A voltage source V and a resistor $R_1$ are arranged in series between the terminals 1 and 2, the resistor $R_1$ producing a voltage-to-current conversion. The current is amplified by the translinear circuit ($Q_1$, $Q_2$, $Q_3$ and $Q_4$) and is supplied to the output by the transistors $T_9$ and $T_{10}$. A compensation circuit 5 provides correction for the non-linearity of the emitter resistance $R_e Q_1$ and $R_e Q_2$ of the transistors $Q_1$ and $Q_2$ respectively.

Between the terminal 1 and a source $I'_3$ of current (value $I_0$) this circuit comprises the series arrangement of a diode-connected transistor $Q_7$ and the main current path of a transistor $Q_5$. Between the terminal 2 and a source $I'_4$ of current (value $I_0$) this circuit further comprises the series arrangement of a diode-connected transistor $Q_8$ and the main current path of a transistor $Q_6$.

The transistors $Q_5$ and $Q_6$ have their respective bases and collectors interconnected.

To provide compensation for the emitter resistances $R_e Q_1$ and $R_e Q_2$, a resistor $R'_2$ of the same value R as the resistor R'$_1$ is connected between the emitters of the transistors Q$_5$ and Q$_6$.

As will be shown, in order to provide compensation for the emitter resistances of the differential followers in accordance with the present invention, it is only necessary to reduce the resistance value of R'$_2$ so that R'$_2$/R'$_1$ is in the range of values between 0.65 to 0.85.

Figure 2:
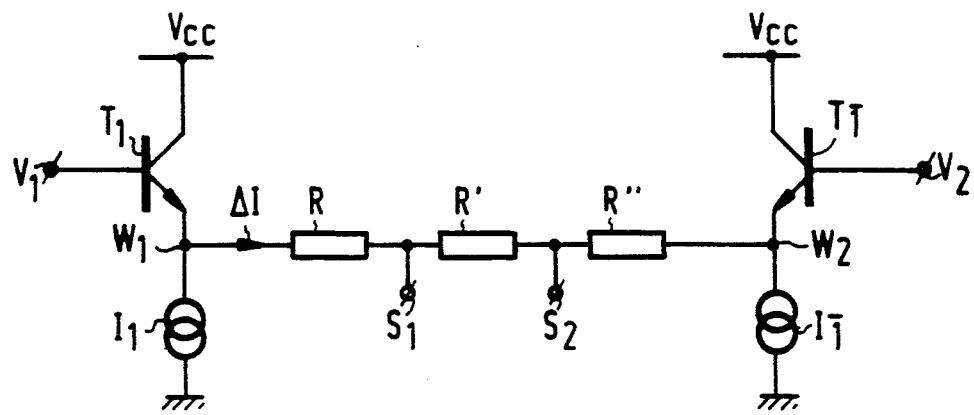
FIG. 2 shows a prior-art differential follower circuit.

A prior-art differential follower circuit (FIG. 2) comprises transistors T$_1$ and T$\overline{1}$, in the present case each is of the npn type, whose collectors are connected to a supply voltage source V$_{cc}$, whose bases are adapted to receive a differential input signal V$_1$ and V$_2$, and whose emitters are interconnected by a series arrangement of resistors R, R', R''. Two current sources of the same value I$_1$ and I$\overline{1}$ are connected to the emitters of the transistors T$_1$ and T$\overline{1}$ respectively. The nodes between the resistors R and R' and between the resistors R' and R'' form the outputs S$_1$ and S$_2$, which are at intermediate voltages between the voltages V$_1$ and V$_2$. Such intermediate voltages are employed in folding and interpolation analog-to-digital converters.

Such converters are described in, for example, the document by Rudy J. van de Plassche "High Speed and High Resolution A/D and D/A converters", Ph. D. Thesis University of Technology (Delft, The Netherlands, published Oct. 1989). In this case the intermediate signals are the coder signals which are interpolated starting from the folding signals. Such converters require high voltage levels (for example, of several volts) with a satisfactory linearity, which is essential for the correct performance of said converters.

The currents in the collector-emitter path of the transistors T$\overline{1}$ and T$_1$ are I$\overline{1}$−ΔI and I$_1$+ΔI respectively, ΔI being the current flowing from the emitter of T$_1$ to the emitter of T$\overline{1}$ through the resistors R, R' and R''. As a result of this, the signals V$_1$ and V$_2$ can be reproduced correctly on the emitters of T$_1$ and T$\overline{1}$ (signals W$_1$ and W$_2$) only if I$_1$ is much larger than ΔI. Moreover, as the currents through T$_1$ and T$\overline{1}$ vary, the base currents drawn under dynamic conditions may be large except if I$_1$ is larger than ΔI.

The distortion (its absolute value) D$_1$ of this arrangement is:

$$D_1 = (V_1 - V_2) - (W_1 - W_2) = V_T \log \frac{I_1 + \Delta I}{I_1 - \Delta I} + 2\left(\frac{R_B}{\beta + 1} + R_E\right)\Delta I$$

where R$_B$ and R$_B$ are the base and emitter lead resistances, β is the current gain of said transistors, and V$_T$=26 mV.

Figure 3:
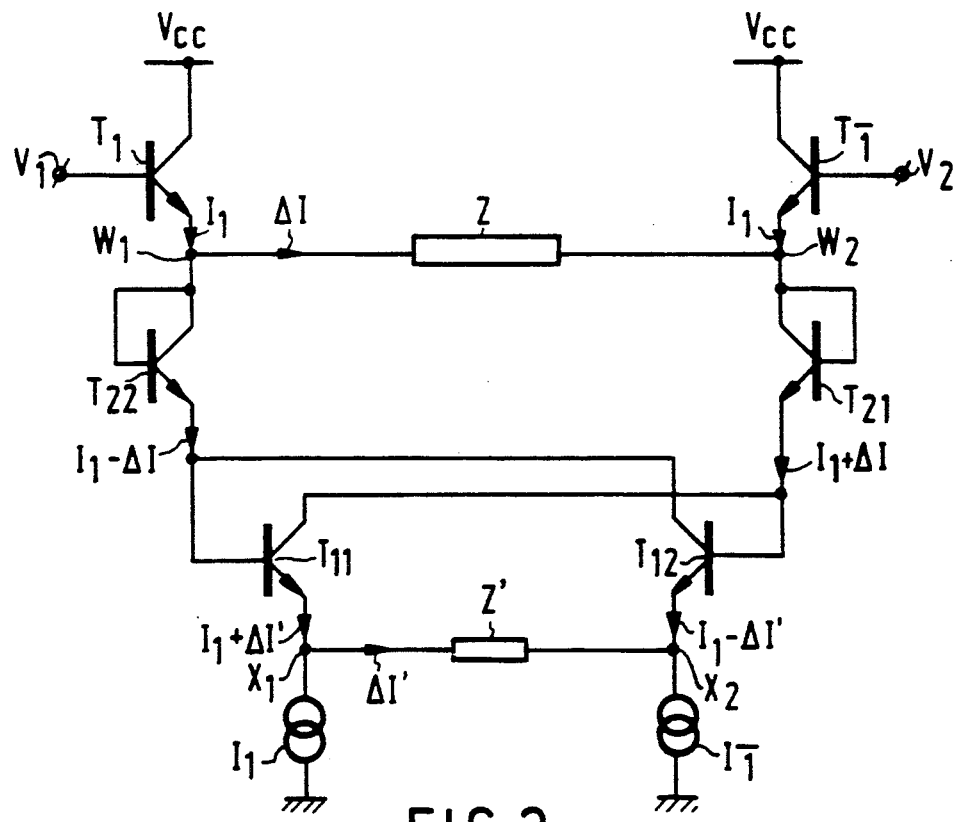
FIG. 3 shows a preferred embodiment of a differential follower circuit in accordance the invention.

In FIG. 3 two transistors T$_{11}$ and T$_{12}$ have their base-emitter paths arranged between the emitters of the transistors T$_1$ and T$\overline{1}$ and the current sources I$_1$ and I$\overline{1}$ respectively and their bases and collectors cross-coupled, i.e. the collector of T$_{11}$ is connected to the base of T$_{12}$ and the collector of T$_{12}$ is connected to the base of T$_{11}$. The emitters of the transistors T$_1$ and T$\overline{1}$ are connected by an impedance Z and those of the transistors T$_{11}$ and T$_{12}$ are connected by an impedance Z', which in accordance with the teaching of U.S. Pat. No. 4,682,098 should have the same value as Z. The impedance Z may be, for example, a chain of resistors, such as the resistors R, R' and R'' in FIG. 2. The diodes T$_{21}$ and T$_{22}$ are arranged in series with the main current paths (collector-emitter paths) of the transistors T$_{11}$ and T$_{12}$, respectively.

The emitters of the transistors T$_1$ and T$\overline{1}$ should always maintain the same current I$_1$. This results in a reduction of the base currents drawn from T$_1$ and from T$\overline{1}$ under dynamic conditions. Moreover, since I$_1$ should no longer be substantially larger than ΔI it is possible to use transistors T$_1$ and T$\overline{1}$ of smaller dimensions, which additionally reduces the current drained from the inputs under dynamic conditions. However, such a compensation only performs satisfactorily for signals of comparatively small amplitude.

In FIG. 3 the two transistors T$_{22}$ and T$_{21}$, connected as diodes by a base-collector short-circuit, are arranged between the emitter of the transistor T$_1$ and the base of the transistor T$_{11}$ and between the emitter of the transistor T$\overline{1}$ and the base of the transistor T$_{11}$. When T$_{21}$, T$_{11}$, T$_{22}$ and T$_{12}$ have the same dimensions (the same base-emitter voltage for the same current), the accumulated base-emitter voltage drops in T$_{21}$ and T$_{11}$ and in T$_{22}$ and T$_{12}$ are the same (the influence of the base currents being ignored), so that the distortion is reduced.

Let D$_3$ be the distortion (absolute value) of this arrangement.

$$D_3 = (V_1 - V_2) - (W_1 - W_2).$$

It is assumed that:

$$E - (W_1 - W_2) - (X_1 - X_2)$$

and $$D_4 = (V_1 - V_2) - (X_1 - X_2) = D_3 + E.$$

It is assumed that ΔI'=the current through the resistance Z', ΔI again being the current through the resistance Z, and the current sources I$_1$ and I$\overline{1}$ having the same intensity I.

The current through the emitter of T$_{11}$ is equal to I$_1$+ΔI$_1$', so that its base current is $$\frac{I_1 + \Delta I'}{\beta + 1}$$

and its collector current is (I$_1$+ΔI')+

$$\frac{\beta}{\beta + 1},$$

where β is the current gain or a transistor.

The current through the emitter of T$_{12}$ is equal to I$_1$−ΔI', so that its base current is $$\frac{I - \Delta I'}{\beta + 1}$$

and its collector current is (I$_1$−ΔI')

$$\frac{\beta}{\beta + 1},$$

assuming that T$_{11}$ and T$_{12}$ are identical.

Consequently, the current I$_{21}$ through the diode-connected transistor T$_{21}$ is equal to:

$$I_{T21} = \frac{\beta}{\beta + 1}(I_1 + \Delta I') + \frac{(I_1 - \Delta I')}{\beta + 1} =$$

-continued $$I_1 + \frac{\beta-1}{\beta+1} \Delta I' = I_1 + \Delta I$$

Therefore, the current $I_{22}$ through the diode-connected transistor $T_{22}$ is:

$$I_{T22} = \frac{\beta}{\beta+1}(I_1 - \Delta I') + \frac{(I_1 + \Delta I')}{\beta+1} =$$

$$I_1 - \frac{\beta-1}{\beta+1} \Delta I' = I - \Delta I$$

This means that:

$$\frac{\beta-1}{\beta+1} \Delta I' = \Delta I$$

This yields $$\Delta I = \frac{\Delta V - D_3}{R_0}$$

$$\Delta I' = \frac{\Delta V - D_3 - E}{R_2} = \frac{\beta+1}{\beta-1} \cdot \frac{\Delta V - D_3}{R_0}$$

When it is assumed that $D_3 0$ (zero distortion) it follows that:

$$\frac{\Delta V}{R_0} = \frac{\beta-1}{\beta+1} \cdot \frac{\Delta V - E}{R_2}$$

so that:

$$R_2 = R_0 \frac{\beta-1}{\beta+1} \left(1 - \frac{E}{\Delta V}\right)$$

Thus it is possible to eliminate the distortion for a given value of $\Delta V$ (E depends on $\Delta V$). The formula shows that $R_2$ is smaller than $R_0$, so that it is possible to achieve compensation by adding a resistor in parallel as already indicated.

EXAMPLE:

$R_0 = 800 \, \Omega$ $R_2 = 640 \, \Omega$, with $R_2/R_0 = 0.8$
$\Delta V_{max} = 1 \, V_{p-p}$
$D_{3max} = 0.3\%$
$D_3 = 0$ for $\Delta V = 0.8 \, V$.

This maximum value of 0.3% corresponds to a precision better than 0.25 bit for a 6-bit converter stage used in an 8-bit folding and interpolation converter.

With $R_2 = R_0$ the maximum distortion would have been more than 0.7%. In practice, the calculation of the ratio $R_2/R_0$ requires computations up to the 5th order and makes it also necessary to allow for the variation of the current gain $\beta$ of the transistors as a function of the current and of the Early effect.

This ratio can be adjusted by plotting the curves $D_3$ as function of $\Delta V$ for different values of the ratio $R_2/R_0$ either with a test circuit or with a simulator. Suitable software for the last-mentioned case is available in the public-domain program SPICE II of the Berkeley University "General Purpose Electronic Simulator". The values of the ratio $R_2/R_0$ which can be used in practice are generally in the range between 0.65 and 0.85. A satisfactory criterion is to adjust the ratio $R_2/R_0$ in such a way that the positive and negative maximum values of the distortion $D_3$ have equal absolute values. For circuits operating in a specific frequency range adjustment is preferably effected at the maximum operating frequency.

It is to be noted that in integrated circuit technology the ratios between resistors are very precise. With current technology this means that the difference between two resistors of the same nominal value is less than 1%. However, the precision on the absolute values is substantially smaller. An advantage of this compensation is that it is the ratio between $R_2$ and $R_0$ which counts.

Figure 4:
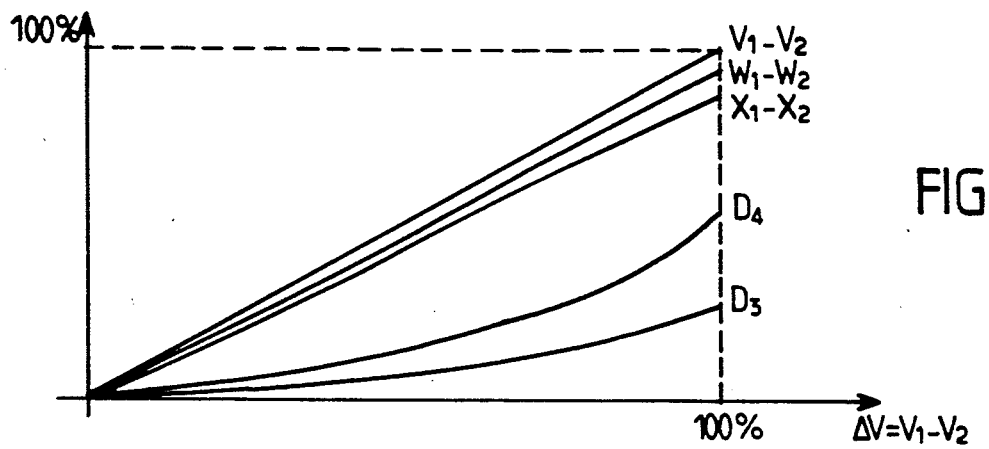
FIGS. 4 and 5 are curves illustrating the optimisation of the distortion.
Figure 5:
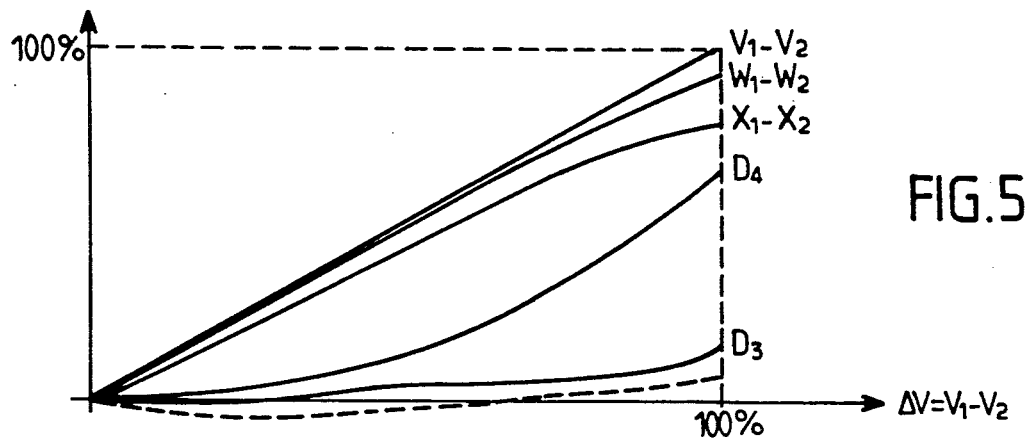

FIGS. 4 and 5 show $\Delta V$ ($=V_1-V_2$), $W_1-W_2$, $X_1-X_2$, $D_3$ and $D_4$ plotted along the Y-axis as a function of $\Delta V = V_1 - V_2$ (along the X-axis) expressed in per cent of the maximum amplitude of $\Delta V$. $D_3$ and $D_4$ have been scaled down along the Y-axis to show the variations more clearly.

In the situation shown in FIG. 4 $R_2 = R_0$. The distortion $D_3$ increases regularly as a function of $\Delta V$.

In the situation shown in FIG. 5 $R_2 < R_0$. The distortion $D_3$ (solid curve for $R_2/R_0 = 0.95$) is initially slightly negative, is then eliminated for a given $\Delta V$ (see formula above), and the maximum distortion is smaller than before. The distortion $D_4$ is larger than in the situation of FIG. 4. The broken-line curve shows $D_3$ for a value of $R_2$ smaller than before and in the above example it includes $R_2/R_0 = 0.8$. For small values of $\Delta V$ the curve $D_3$ is more oriented towards the negative values. $D_3$ passes through the value 0 for a value of $\Delta V$ larger than before and the distortion for $\Delta V = 100\%$ of the scale is smaller than before.

In practice it is thus possible to choose a value for $R_2$ by means of which the distortion $D_3$ can be optimized in accordance with a selected criterion, for example a (positive or negative) maximum distortion below a given value or rather a positive distortion below a given mid-scale value, the curves and the value of $R_2$ being preferably obtained by simulation.

Figure 6:
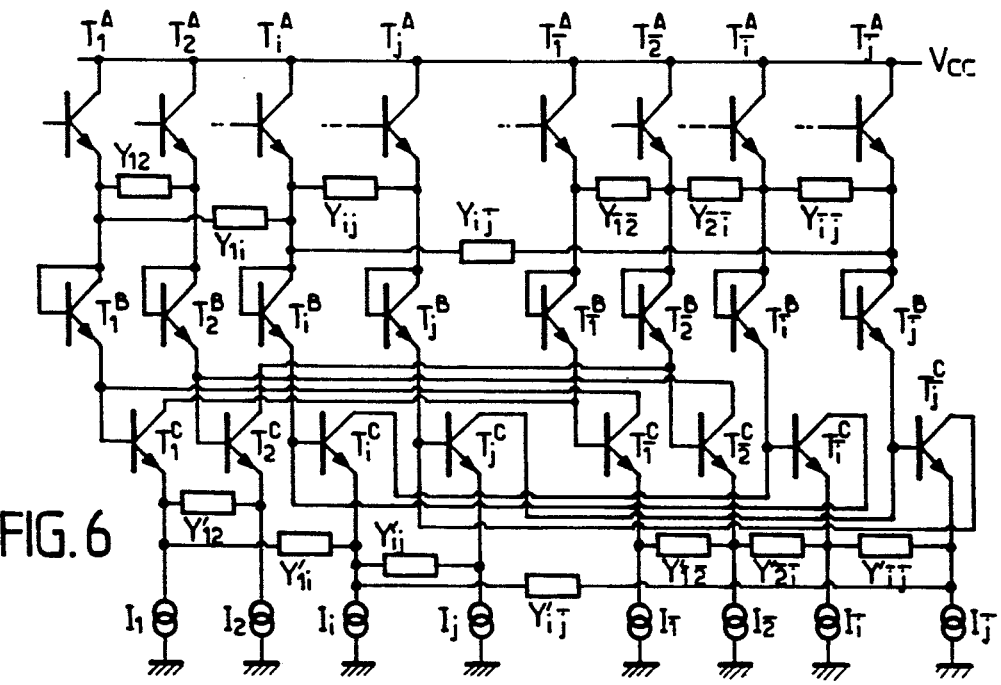
FIG. 6 shows a multiple follower circuit in accordance with the invention.

FIG. 6 shows a circuit arrangement combining a plurality of elementary circuits as defined above and in which the admittances can be arranged between the emitters of all the transistors (i.e. not only those of the same pair). It is assumed that:

$$\left(T_1^A, T_1^A\right), \left(T_2^A, T_2^A\right) \ldots \left(T_i^A, T_i^A\right), \left(T_j^A, T_j^A\right)$$

are the transistor pairs receiving the same input signals. $Y_{12}$ is an admittance arranged between the emitters of the transistors $T_1^A$ and $T_2^A$.

$Y_{\overline{12}}$ is an admittance arranged between the emitters of the transistors $T_{\overline{1}}^A$ and $T_{\overline{2}}^A$ In more general terms:

$Y_{ij}$ or $Y_{ji}$, regardless of the values of i and j, represents the admittance of an impedance (or of a network) arranged between the emitters of the transistors $T_i^A$ and $T_j^A$.

$Y_{\overline{ij}}$ or $Y_{\overline{ji}}$, regardless of the values of i and j, represents the admittance of an impedance (or of a network) arranged between the emitters of the transistors $T_{\overline{i}}^A$ and $T_{\overline{j}}^A$.

It is assumed that:

$$T_1^B, T_2^B, \ldots T_i^B, \ldots T_j^B, T_{\overline{1}}^B, T_{\overline{2}}^B, \ldots T_{\overline{i}}^B, \ldots T_{\overline{j}}^B$$

are the diode-connected compensation transistors associated with the aforementioned transistors bearing the same index numeral.

Finally, it is assumed that:

$$\left(T_1^c, T\frac{c}{1}\right), \left(T_2^c, T\frac{c}{2}\right), \ldots \left(T_i^c, T\frac{c}{i}\right) \ldots \left(T_j^c, T\frac{c}{j}\right)$$

are the transistor pairs with cross-coupled base-collector interconnections associated with the preceding pairs having two similar index numerals.

$Y'_{12}$ is the admittance of an impedance or of a network arranged between the emitters of the transistors $T_1^c$ and $T_2^c$ $Y'_{\overline{12}}$ is the admittance of an impedance or a network arranged between the emitters of the transistors $T_{\overline{1}}^c$ and $T_{\overline{2}}^c$ $Y'_{ij}$ or $Y'_{ji}$ (regardless of i, j) is the admittance of an impedance or a network arranged between the emitters of the transistors $T_i^c$ and $T_j^c$ $Y'_{\overline{ij}}$ or $Y'_{\overline{ji}}$ (regardless of i, j) is the admittance of an impedance or a network arranged between the emitters of the transistors $T_{\overline{i}}^C$ and $T_{\overline{j}}^c$ If it is assumed that the input signals driving the input transistors $(T_1^A \ldots T_j^A)$ differential signals having the same common-mode voltage, an optimum operation is obtained if the following requirements are met:

$$Y_{i,j} = Y_{\overline{i}\overline{j}}$$

$$Y_{\overline{i},j} = Y_{i\overline{j}}$$

which ensures an equilibrium of the currents. This also holds for the admittances Y':

$$Y'_{i,j} = Y'_{\overline{i}\overline{j}}$$

$$Y'_{\overline{i},j} = Y'_{i\overline{j}}$$

The admittances $Y'_{\overline{ij}}$ (i.e. arranged between the emitters of the same pair) have a nominal value smaller than the admittances $Y_{i,\overline{ij}}$.

I claim:

1. A distortion-compensated differential circuit which comprises: a differential stage comprising a first and a second transistor whose emitters are coupled together via a first impedance and having input terminals for an input signal source, and a distortion compensation circuit comprising, in series between the emitter of the first transistor and a first current source, a first diode and the main current path of a third transistor, and in series between the emitter of the second transistor and a second current source, a second diode and the main current path of a fourth transistor, wherein the third and fourth transistors have their respective bases and collectors interconnected and have their emitters coupled together via a second impedance, characterized in that the second impedance has a nominal value smaller than that of the first impedance.

2. A circuit as claimed in claim 1, wherein the first and the second impedance are resistive.

3. A circuit as claimed in claim 2 wherein the ratio between the second impedance and the first impedance is within the range of values from 0.65 to 0.85.

4. A circuit as claimed in claim 1, wherein the ratio between the second impedance and the first impedance is within the range of values from 0.65 to 0.85.

5. A circuit as claimed in claim 4 wherein the differential stage is connected to form a voltage-current converter wherein said input terminals are connected in series with the first impedance.

6. A circuit as claimed in claim 4 wherein the differential stage is connected to form a differential follower, the bases of the first and the second transistor forming said input terminals.

7. A distortion-compensated differential circuit as claimed in claim 4 wherein respective bases of the first and second transistors are coupled to said signal input terminals so as to form a differential follower circuit.

8. A distortion-compensated differential circuit as claimed in claim 4 wherein said first and second diodes comprise diode-connected transistors and all of said transistors of the distortion-compensated differential circuit are of the same polarity type.

9. A circuit as claimed in claim 1 wherein the differential stage is adapted to form a voltage-current converter, said input terminals being connected in series with the first impedance.

10. A circuit as claimed in any one of the claim 1 wherein the differential stage is connected to form a differential follower, the bases of the first and the second transistor forming said input terminals.

11. A multiple follower circuit, which comprises a plurality of differential follower circuits as claimed in claim 10, the first, the second, the third and the fourth transistor of the differential follower circuit of the rank i being denominated $T_i^A$, $T_{\overline{i}}^A$, $T_i^c$ and $T_{\overline{i}}^c$ respectively, first impedances connected between the emitters of at least some of the transistors of a first group comprising the first and second transistor, the admittance of said first impedances being designated Y followed by two indexes corresponding to those of the two transistors of said first group between whose emitters said impedance is connected, and second impedances connected between the emitters of at least some of the transistors of a second group comprising the third and the fourth transistor, the admittance of said second impedances being designated Y' followed by two indexes corresponding to those of the two transistors of said second group between whose emitters said impedance is connected, and regardless of i, j, ī and j̄ the following is valid $$Y_{ij} = Y_{\overline{i}\overline{j}} > Y'_{ij} = Y'_{\overline{i}\overline{j}}$$

$$Y_{\overline{i}j} = Y_{i\overline{j}} > Y'_{\overline{i}j} = Y'_{i\overline{j}}.$$

12. A distortion-compensated voltage, current converter comprising:
first and second supply terminals,
first and second diode-connected transistors,
a first current source,
first means coupling said first current source and said first diode-connected transistor in series between the first supply terminal and a first terminal.
second means coupling said first current source and said second diode-connected transistor in series between the first supply terminal and a second terminal,
first and second signal voltage input terminals,
a first impedance,
first means connecting said first impedance and said first and second signal voltage input terminals in series to said first and second terminals, first and second output transistors having individual control electrodes coupled to said first and second terminals, respectively, second means connecting said first and second output transistors to the second supply terminal via a common second current source, and a distortion-compensation circuit comprising;

third and fourth transistors having their respective base and collector electrodes cross-coupled to one another, third means connecting said third and fourth transistors to said first and second terminals, respectively, and a second impedance intercoupling one main electrode of the third transistor to a corresponding one main electrode of the fourth transistor, and wherein the impedance of the second impedance is less than the impedance of the first impedance.

13. A voltage,current converter as claimed in claim 12 wherein the ratio of the second impedance ($Z_2$) to the first impedance ($Z_1$) is within the range of values 0.65 to 0.85.

14. A voltage,current converter as claimed in claim 13 wherein said third connecting means comprises first and second diodes connected in series with said third and fourth transistors, respectively, and third and fourth current sources connected between said third and fourth transistors, respectively, and said second supply terminal, 15. A voltage,current converter as claimed in claim 13 further comprising a further current source coupled to said second terminal for supplying a compensation current which compensates for control electrode currents of the first and second output transistors.

* * * * *